(12) United States Patent
Kim et al.

(10) Patent No.: US 8,790,941 B2
(45) Date of Patent: Jul. 29, 2014

(54) ARRAY SUBSTRATE FOR FRINGE FIELD SWITCHING MODE LIQUID CRYSTAL DISPLAY DEVICE AND METHOD OF MANUFACTURING THE SAME

(75) Inventors: Jeong-Oh Kim, Seoul (KR); Jung-Sun Beak, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 175 days.

(21) Appl. No.: 13/166,048

(22) Filed: Jun. 22, 2011

(65) Prior Publication Data
US 2011/0310341 A1 Dec. 22, 2011

(30) Foreign Application Priority Data

Jun. 22, 2010 (KR) ........................ 10-2010-0059169

(51) Int. Cl.
H01L 21/44 (2006.01)
H01L 27/14 (2006.01)
G02F 1/133 (2006.01)

(52) U.S. Cl.
USPC .......................................... 438/30; 349/140

(58) Field of Classification Search
None
See application file for complete search history.

(56) References Cited

U.S. PATENT DOCUMENTS

| | | | | |
|---|---|---|---|---|
| 2007/0090422 A1* | 4/2007 | Ishii | ............................. | 257/291 |
| 2007/0166895 A1* | 7/2007 | Lee | ................................ | 438/151 |
| 2008/0158457 A1* | 7/2008 | Park et al. | ....................... | 349/39 |
| 2008/0266479 A1* | 10/2008 | Lim | ................................ | 349/46 |
| 2011/0037931 A1* | 2/2011 | Im et al. | ........................ | 349/113 |

FOREIGN PATENT DOCUMENTS

KR 10-2008-0012767 * 2/2008

* cited by examiner

*Primary Examiner* — Zandra Smith
*Assistant Examiner* — Pamela E Perkins
(74) *Attorney, Agent, or Firm* — McKenna, Long & Aldridge LLP

(57) ABSTRACT

A method of manufacturing an array substrate for an FFS mode LCD device includes forming a gate line, a gate electrode and a pixel electrode on a substrate; forming a gate insulating layer; forming a data line, source and drain electrodes, and a semiconductor layer on the gate insulating layer, the drain electrode overlapping the pixel electrode; forming a passivation layer on the data line, the source and drain electrodes; forming a contact hole exposing the drain electrode and the pixel electrode by patterning the passivation layer and the gate insulating layer; and forming a common electrode and a connection pattern on the passivation layer, wherein the common electrode includes bar-shaped openings and a hole corresponding to the contact hole, and the connection pattern is disposed in the hole, is spaced apart from the common electrode and contacts the drain electrode and the pixel.

5 Claims, 17 Drawing Sheets

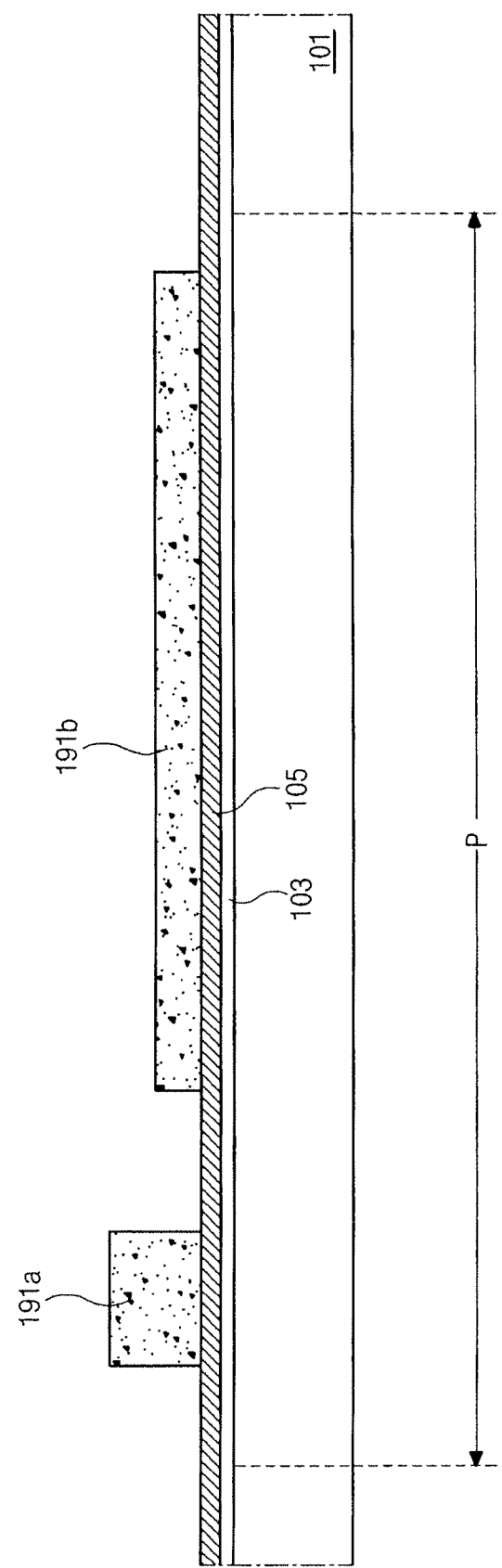

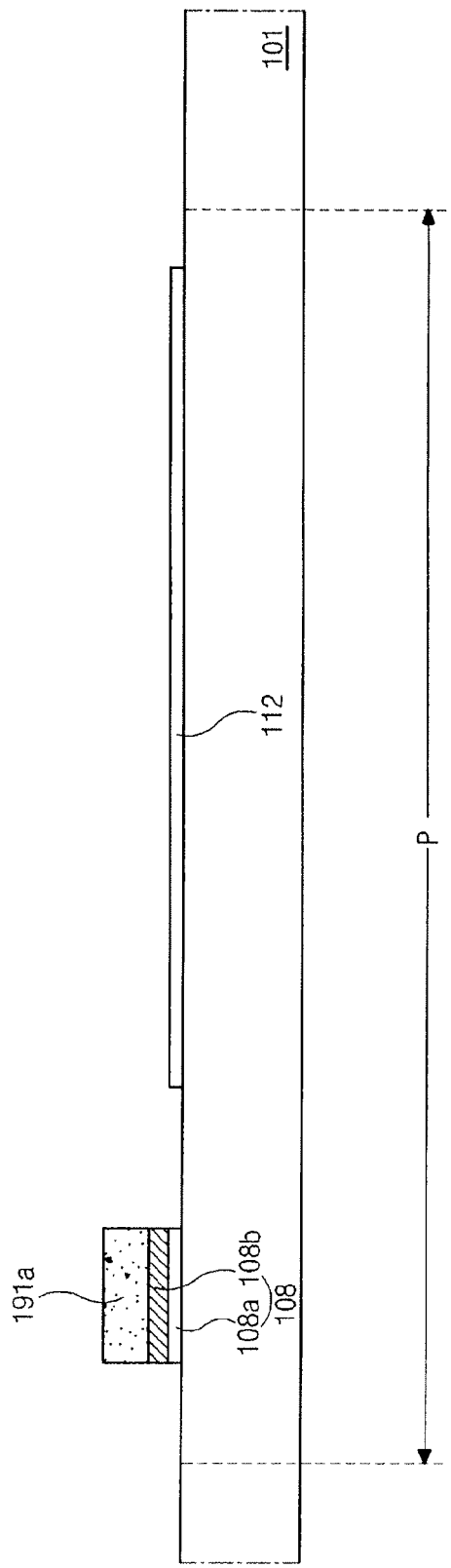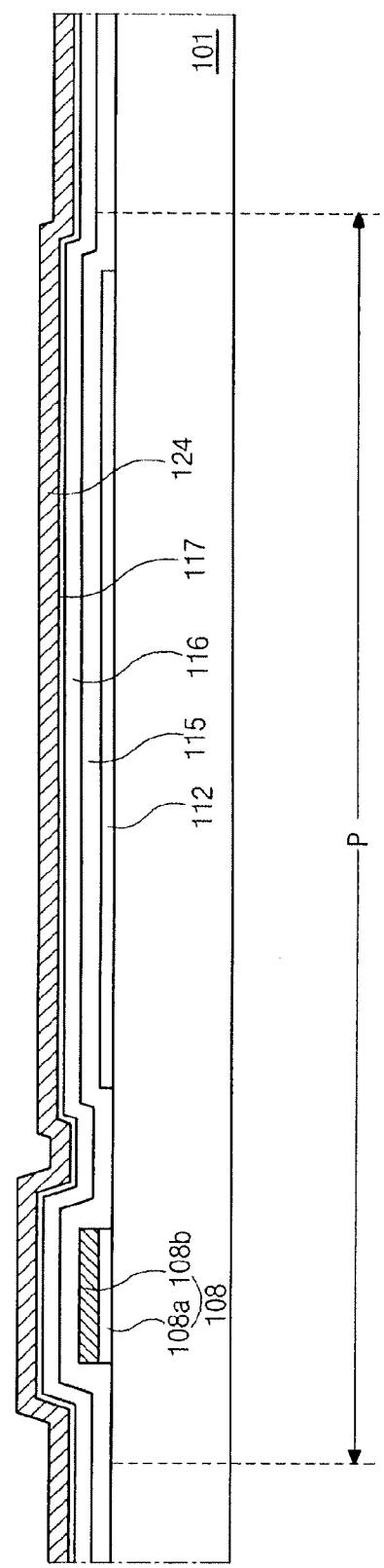

ARRAY SUBSTRATE FOR FRINGE FIELD SWITCHING MODE LIQUID CRYSTAL DISPLAY DEVICE AND METHOD OF MANUFACTURING THE SAME

This application claims the benefit of Korean Patent Application No. 10-2010-0059169 filed in Korea on Jun. 22, 2010, which is hereby incorporated by reference for all purposes as if fully set forth herein.

BACKGROUND OF THE INVENTION

1. Field of the Invention

The invention relates to a liquid crystal display device, and more particularly, to an array substrate for a fringe field switching (FFS) mode liquid crystal display (LCD) device and a method of manufacturing the same.

2. Discussion of the Related Art

Generally, a liquid crystal display (LCD) device uses optical anisotropy and polarization properties of liquid crystal molecules. The liquid crystal molecules have a definite alignment direction as a result of their thin and long shapes. The alignment direction of the liquid crystal molecules can be controlled by applying an electric field across the liquid crystal molecules.

In other words, as the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling the light transmittance of the liquid crystal molecules.

Since the LCD device including thin film transistors as a switching element, referred to as an active matrix LCD (AM-LCD) device, has excellent characteristics of high resolution and displaying moving images, the AM-LCD device has been widely used.

The AM-LCD device includes an array substrate, a color filter substrate and a liquid crystal layer interposed therebetween. The array substrate may include a pixel electrode and a thin film transistor, and the color filter substrate may include a color filter layer and a common electrode. The AM-LCD device is driven by an electric field between the pixel electrode and the common electrode to have excellent properties of transmittance and aperture ratio. However, since the AM-LCD device uses a vertical electric field that is perpendicular to the substrates, the AM-LCD device has poor viewing angles.

An in-plane switching (IPS) mode LCD device having a wide viewing angle property has been suggested and developed to resolve the above-mentioned limitations.

FIG. 1 is a cross-sectional view of a related art IPS mode LCD device. As shown in FIG. 1, the IPS mode LCD device includes an upper substrate 9 and a lower substrate 10 spaced apart from and facing each other. A liquid crystal layer 11 is interposed between the upper and lower substrates 9 and 10. A common electrode 17 and a pixel electrode 30 are formed on the lower substrate 10. The common electrode 17 and the pixel electrode 30 may be disposed on the same level. Liquid crystal molecules of the liquid crystal layer 11 are driven by a horizontal electric field L, which is induced between the common and pixel electrodes 17 and 30. Although not shown in the figure, a color filter layer is formed on the upper substrate 9. The upper substrate 9 including the color filter layer may be referred to as a color filter layer. The lower substrate 10 including the common electrode 17 and the pixel electrode 30 may be referred to as an array substrate.

FIGS. 2A and 2B are cross-sectional views showing turned on/off conditions, respectively, of a related art IPS mode LCD device. As shown in FIG. 2A, when the voltage is applied to the IPS mode LCD device, arrangement of liquid crystal molecules 11a above the common electrode 17 and the pixel electrode 30 is unchanged. However, liquid crystal molecules 11b between the common electrode 17 and the pixel electrode 30 are horizontally arranged due to the horizontal electric field L. Since the liquid crystal molecules 11b are arranged by the horizontal electric field L, the IPS mode LCD device has a wide viewing angle property. For example, the IPS mode LCD device has viewing angles of about 80 degrees to about 85 degrees up and down and right and left without an image inversion or a color inversion.

FIG. 2B shows a condition when the voltage is not applied to the IPS mode LCD device. Because an electric field is not induced between the common and pixel electrodes 17 and 30, the arrangement of liquid crystal molecules 11 of the liquid crystal layer is not changed.

Therefore, the IPS mode LCD device has the improved viewing angles.

However, the IPS mode LCD device has disadvantages of low aperture ratio and transmittance. To improve the aperture ratio and transmittance of the IPS mode LCD device, a fringe field switching (FFS) mode LCD device has been suggested.

FIG. 3 is a cross-sectional view of a pixel region of an array substrate for a related art FFS mode LCD device.

As shown in FIG. 3, in the array substrate for the related art FFS mode LCD device, a gate line (not shown) and a data line 47, which cross each other to define a pixel region P, are formed with a gate insulating layer 45 interposed therebetween. A thin film transistor Tr is formed at the pixel region P and is connected to the gate line and the data line 47.

A pixel electrode 55 is formed at the pixel region P on the gate insulating layer 45 and is connected to a drain electrode 51 of the thin film transistor Tr. The pixel electrode 55 has a plate shape. Here, the pixel electrode 55 is formed on the same layer as the data line 47, i.e., the gate insulating layer 45 and is spaced apart from the data line 47 to prevent a short circuit with the data line 47.

A passivation layer 60 is formed on the data line 47 and the pixel electrode 55 substantially all over. The passivation layer 60 is formed of an inorganic insulating material. A common electrode 65 is formed on the passivation layer 60 substantially all over and includes openings oa corresponding to the pixel region P. The openings oa has a bar shape and are spaced apart from each other.

The array substrate for the related art FFS mode LCD device having the above-mentioned structure is manufactured through 5 mask processes: forming a gate line (not shown) and a gate electrode 43, forming a semiconductor layer 46 including an active layer 46a and ohmic contact layers 46b, the data line 47, and source and drain electrodes 49 and 51, forming the pixel electrode 55, forming the passivation layer 60 including a contact hole (not shown), and forming the common electrode 65 including the openings oa.

The mask process, which means a photolithographic process, includes steps of forming a photoresist layer after a material layer to be patterned is formed on a substrate, exposing the photoresist layer to light through a photo-mask which includes a light-blocking portion and a light-transmitting portion, developing the light-exposed photoresist layer to thereby form a photoresist pattern, etching the material layer using the photoresist pattern as an etching mask, and stripping the photoresist pattern. Therefore, to perform one mask process, many materials, process apparatuses and process time for every step are needed.

Since each mask process includes many steps, the manufacturing processes and costs are increased. Accordingly, decreasing the mask processes has been tried to reduce the manufacturing costs and increase the productivity.

SUMMARY OF THE INVENTION

Accordingly, the present invention is directed to an array substrate for a fringe field switching mode liquid crystal display device and a method of manufacturing the same that substantially obviate one or more of the problems due to limitations and disadvantages of the related art.

An object of the present invention is to provide an array substrate for a fringe field switching mode liquid crystal display device and a method of manufacturing the same that reduce the manufacturing processes, decrease the manufacturing costs, and improve the productivity.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of embodiments of the invention, as embodied and broadly described, a method of manufacturing an array substrate for a fringe field switching mode liquid crystal display device includes forming a gate line, a gate electrode and a pixel electrode on a substrate including a pixel region defined thereon, the pixel electrode disposed in the pixel region; forming a gate insulating layer on the gate line, the gate electrode and the pixel electrode; forming a data line, a source electrode, a drain electrode, and a semiconductor layer on the gate insulating layer, the data line crossing the gate line to define the pixel region, the semiconductor layer disposed over the gate electrode, the source electrode and the drain electrode spaced apart from each other over the semiconductor layer, the drain electrode overlapping the pixel electrode; forming a passivation layer on the data line, the source electrode and the drain electrode; forming a contact hole exposing the drain electrode and the pixel electrode by patterning the passivation layer and the gate insulating layer; and forming a common electrode and a connection pattern on the passivation layer, wherein the common electrode includes bar-shaped openings in the pixel region and a hole corresponding to the contact hole, and the connection pattern is disposed in the hole, is spaced apart from the common electrode and contacts the drain electrode and the pixel electrode.

In another aspect, an array substrate for a fringe field switching mode liquid crystal display device includes a gate line and a gate electrode on a substrate including a pixel region defined thereon; a pixel electrode in the pixel region on the substrate; a gate insulating layer on the gate line, the gate electrode and the pixel electrode; a semiconductor layer, a data line, a source electrode and a drain electrode on the gate insulating layer, the semiconductor layer corresponding to the gate electrode, the data line crossing the gate line to define the pixel region, the source and drain electrodes spaced apart from each other over the semiconductor layer, the drain electrode overlapping the pixel electrode; a passivation layer on the data line, the source electrode and the drain electrode, wherein the passivation layer and the gate insulating layer has a contact hole exposing the drain electrode and the pixel electrode; and a common electrode and a connection pattern on the passivation layer, wherein the common electrode includes bar-shaped openings in the pixel region and a hole corresponding to the contact hole, and the connection pattern is disposed in the hole, is spaced apart from the common electrode and contacts the drain electrode and the pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 5A to 5K are cross-sectional views taken along the line V-V of FIGS. 4A to 4D in steps of a method of fabricating the FFS mode LCD device according to the embodiment of the invention.

DETAILED DESCRIPTION OF EXEMPLARY EMBODIMENTS

Reference will now be made in detail to an exemplary embodiment of the invention, which is illustrated in the accompanying drawings.

FIGS. 4A to 4D are plan views of one pixel region of an array substrate for a fringe field switching (FFS) mode liquid crystal display (LCD) device in steps of a method of fabricating the same according to an embodiment of the invention. FIGS. 5A to 5K are cross-sectional views taken along the line V-V of FIGS. 4A to 4D in steps of a method of fabricating the FFS mode LCD device according to the embodiment of the invention.

Figure 1:
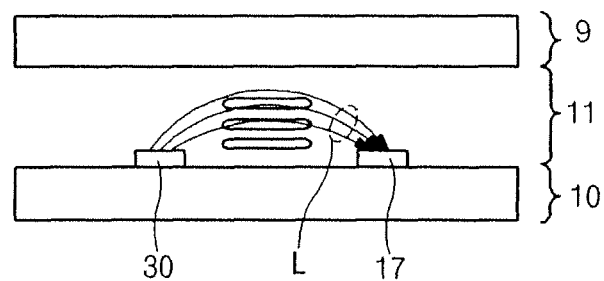
FIG. 1 is a cross-sectional view of a related art IPS mode LCD device.
Figure 2A:
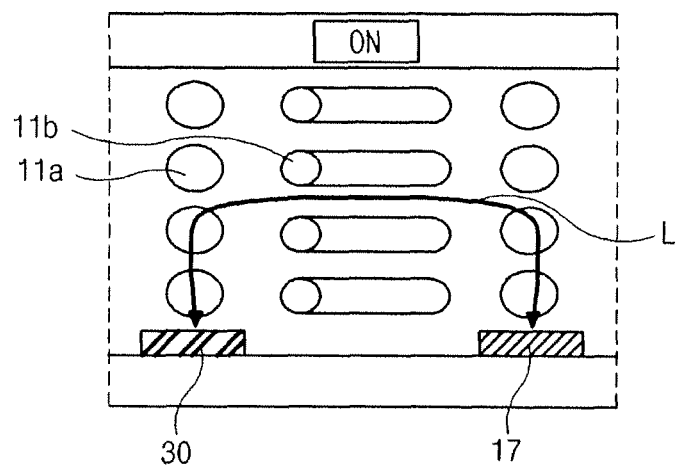
FIGS. 2A and 2B are cross-sectional views showing turned on/off conditions, respectively, of a related art IPS mode LCD device.
Figure 2B:
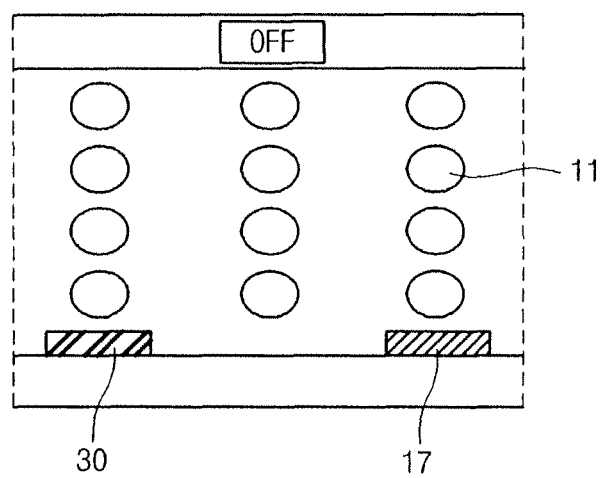
Figure 3:
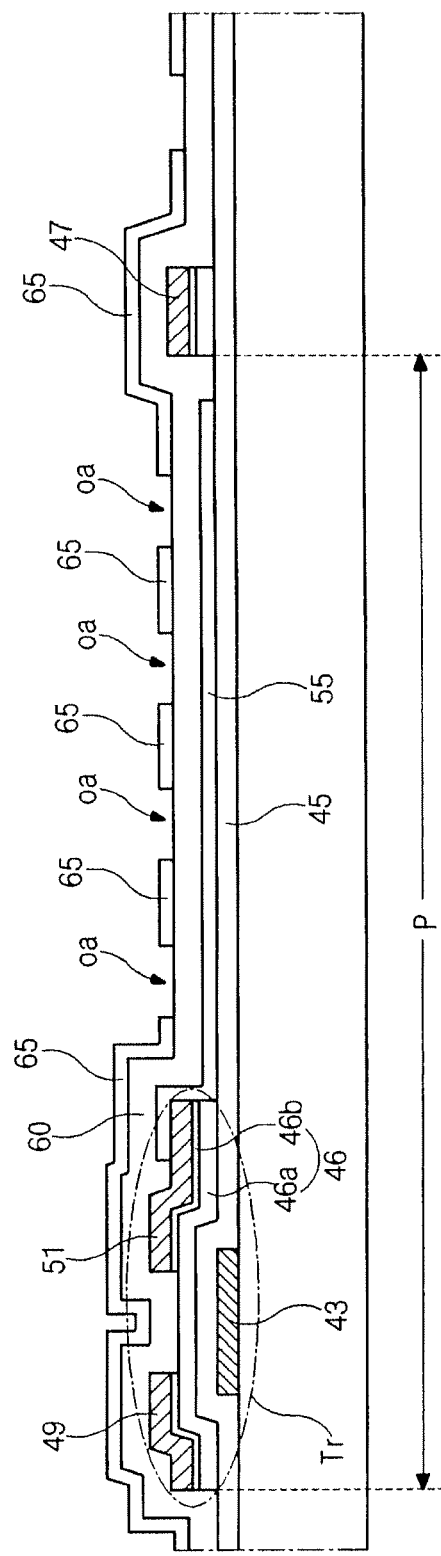
FIG. 3 is a cross-sectional view of a pixel region of an array substrate for a related art FFS mode LCD device.
Figure 4A:
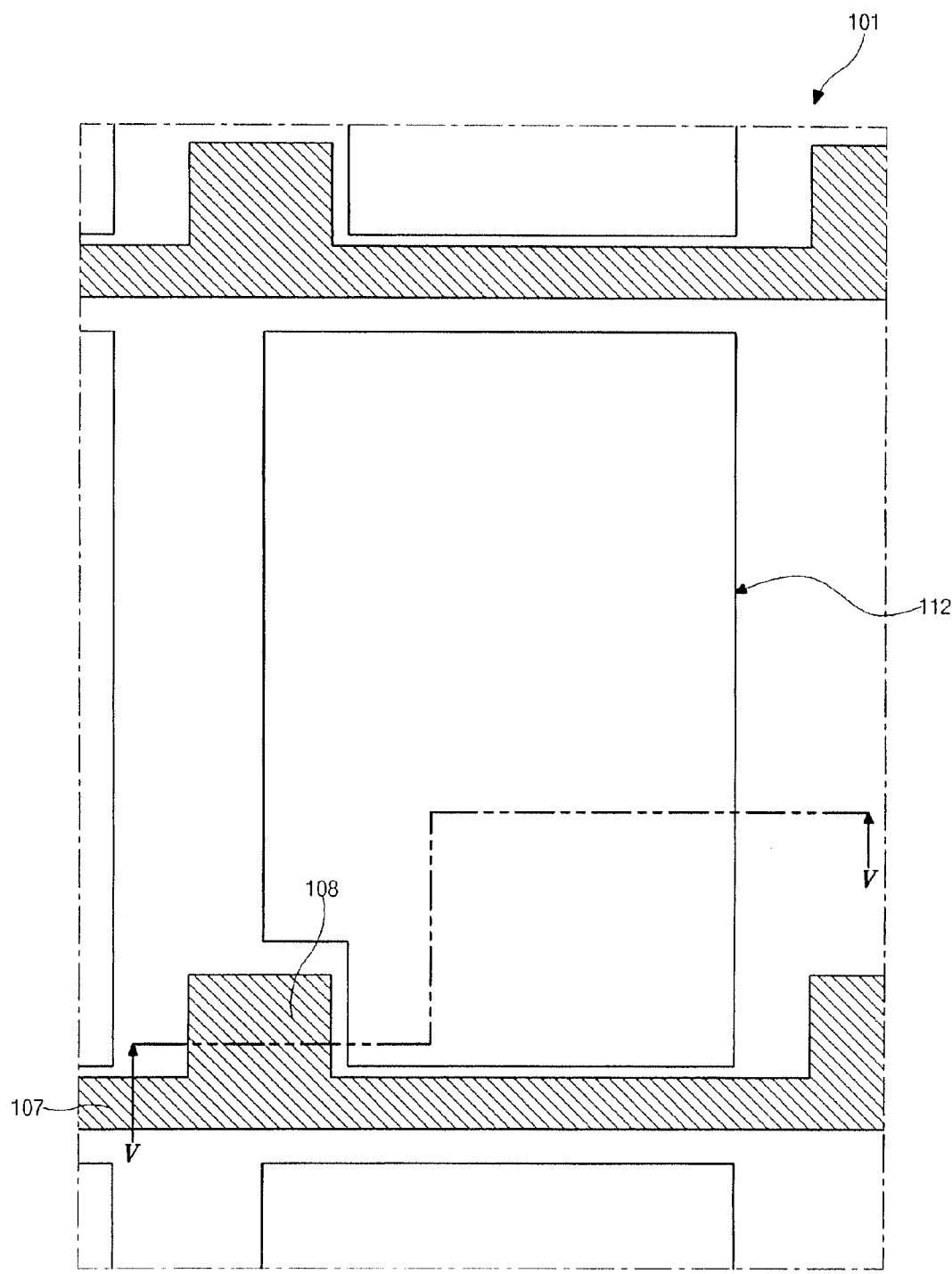
FIGS. 4A to 4D are plan views of one pixel region of an array substrate for an FFS mode LCD device in steps of a method of fabricating the same according to an embodiment of the invention.

In FIG. 4A and FIG. 5A, a first transparent conductive material layer 103 is formed on a transparent substrate 101, and a first metallic layer 105 is formed on the first transparent conductive material layer 103. The first transparent conductive material layer 103 may be formed of a transparent conductive material such as indium tin oxide or indium zinc oxide. The first metallic layer 105 may be formed of a first metallic material having relatively low resistivity, for example, one or more of aluminum (Al), aluminum alloy such as aluminum neodymium (AlNd), copper (Cu), copper alloy, molybdenum (Mo), and molybdenum alloy such as molybdenum titanium (MoTi). The first metallic layer 105 may have a single-layered structure or a multi-layered structure.

Next, photoresist is applied to the first metallic layer 105 to thereby form a first photoresist layer (not show). A first mask (not shown), which includes a light-transmitting portion, a half light-transmitting portion and a light-blocking portion, is disposed over the first photoresist layer. The first photoresist layer is exposed to light through the first mask and is developed to thereby form a first photoresist pattern 191a and a second photoresist pattern 191b. The first photoresist pattern 191a corresponds to areas for forming a gate line and a gate electrode and has a first thickness. The second photoresist pattern 191b corresponds to an area for forming a pixel electrode and has a second thickness which is thinner than the first thickness.

Figure 5B:
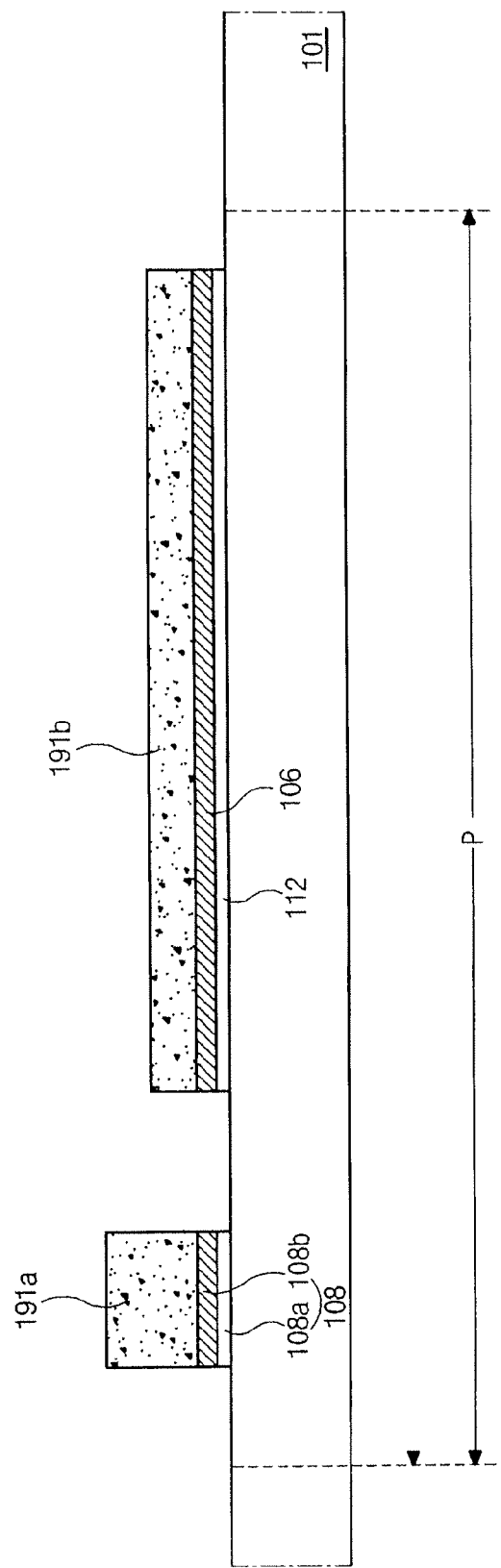

In FIG. 4A and FIG. 5B, the first metallic layer 105 of FIG. 5A and the first transparent conductive material layer 103 of FIG. 5A are removed using the first and second photoresist patterns 191a and 191b as an etching mask to thereby form a gate line 107, a gate electrode 108, a pixel electrode 112 and a dummy metallic pattern 106. Each of the gate line 107 and the gate electrode 108 includes a lower layer 108a of the transparent conductive material and an upper layer 108b of the metallic material. The gate line 107 is formed at the border of a pixel region P along one direction. The pixel electrode 112 and the dummy metallic pattern 106 are spaced apart from the gate line 107 and the gate electrode 108 and are disposed at the pixel region P. The pixel electrode 112 has a plate shape and includes the transparent conductive material. The dummy metallic pattern 106 is disposed on the pixel electrode 112 and includes the metallic material.

Figure 5C:
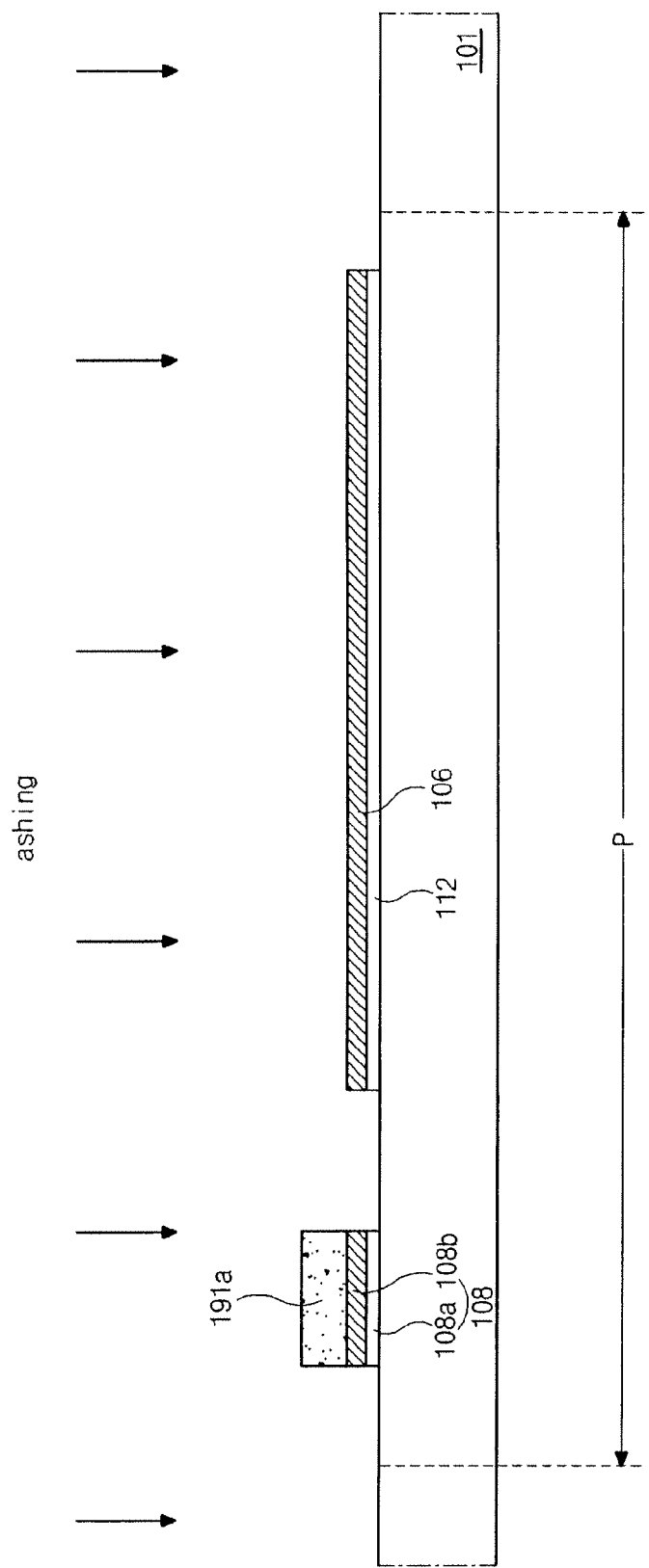

In FIG. 4A and FIG. 5C, an ashing process is performed to thereby remove the second photoresist pattern 191b of FIG. 5B and expose the dummy metallic pattern 106. Here, the first photoresist pattern 191a still remains on the gate line 107 and the gate electrode 108. At this time, the first photoresist pattern 191a also is partially removed by the aching process, and the first thickness of the first photoresist pattern 191a is reduced.

In FIG. 4A and FIG. 5D, the dummy metallic pattern 106 of FIG. 5C, which is exposed by removing the second photoresist pattern 191b of FIG. 5B, is etched and removed to thereby expose the pixel electrode 112.

Figure 4B:
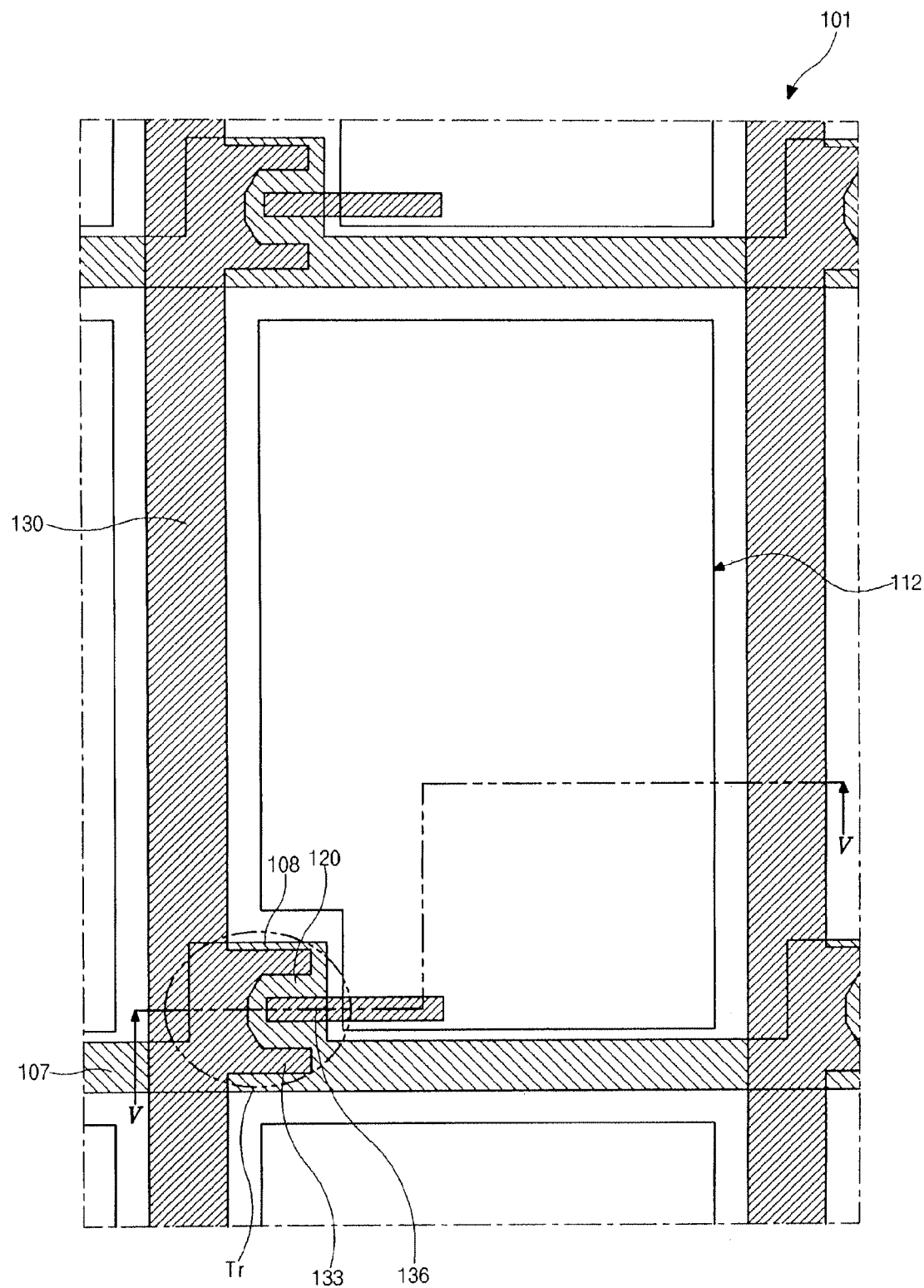

Next, in FIG. 4B and FIG. 5E, a stripping process is performed, and the first photoresist pattern 191a of FIG. 5D is removed to thereby expose the gate line 107 and the gate electrode 108.

Then, a gate insulating layer 115 is formed on a substantially entire surface of the substrate 101 including the gate line 107, the gate electrode 108 and the pixel electrode 112, and an intrinsic amorphous silicon layer 116 and an impurity-doped amorphous silicon layer 117 are formed on the gate insulating layer 115. The gate insulating layer 115 may be formed by depositing an inorganic insulating material, for example, silicon oxide ($SiO_2$) or silicon nitride (SiNx), in a chemical vapor deposition (CVD) apparatus. The intrinsic amorphous silicon layer 116 and the impurity-doped amorphous silicon layer 117 may be formed by depositing intrinsic amorphous silicon and impurity-doped amorphous silicon in the CVD apparatus, respectively. That is, the gate insulating layer 115, the intrinsic amorphous silicon layer 116 and the impurity-doped amorphous silicon layer 117 may be sequentially formed in the same CVD apparatus by using different source gases.

Next, a second metallic layer 124 is formed on the impurity-doped amorphous silicon layer 117 by depositing a second metallic material a sputtering apparatus (not shown). The second metallic material may be one or more of aluminum (Al), aluminum alloy such as aluminum neodymium (AlNd), copper (Cu), copper alloy, molybdenum (Mo), molybdenum alloy such as molybdenum titanium (MoTi), and chromium (Cr). The second metallic layer 124 may have a single-layered structure or a multi-layered structure.

Figure 5F:
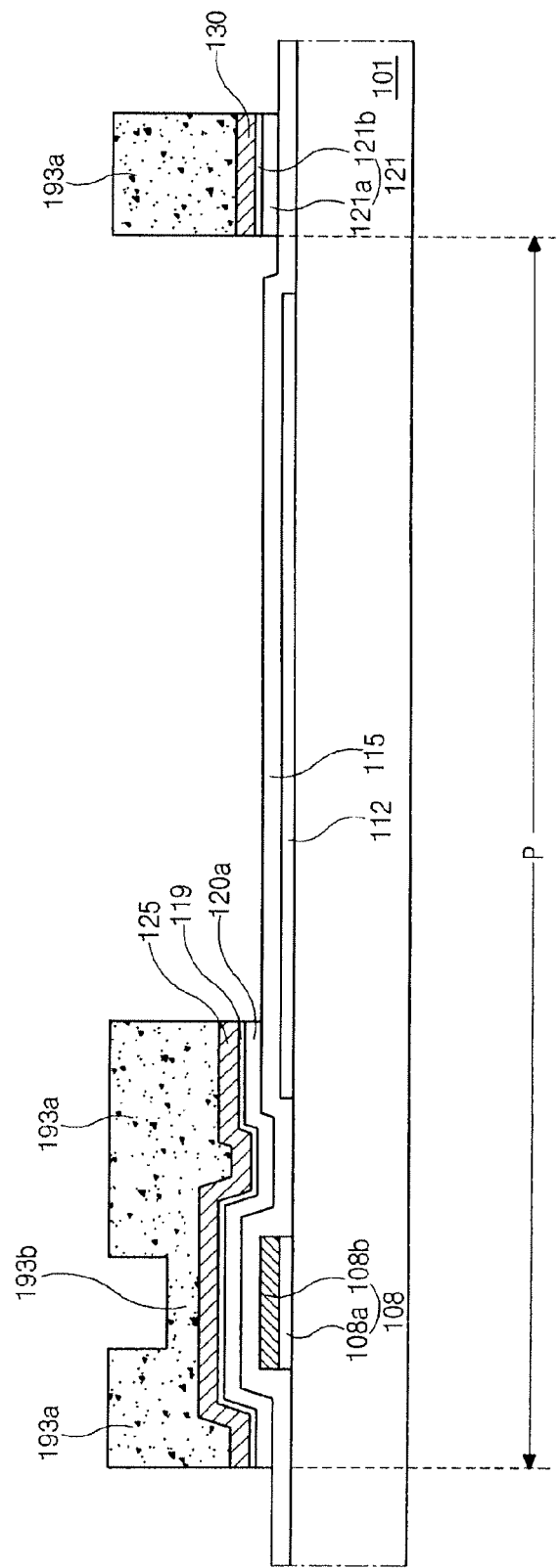

In FIG. 4B and FIG. 5F, photoresist is applied to the second metallic layer 124 of FIG. 5E to thereby form a second photoresist layer (not shown). A second mask (not shown), which includes a light-transmitting portion, a half light-transmitting portion and a light-blocking portion, is disposed over the second photoresist layer. The second photoresist layer is exposed to light through the second mask and is developed to thereby form a third photoresist pattern 193a and a fourth photoresist pattern 193b. The third photoresist pattern 193a has a third thickness, and the fourth photoresist pattern 193b has a fourth thickness thinner than the third thickness.

Then, the second metallic layer 124 of FIG. 5E, the impurity-doped amorphous silicon layer 117 of FIG. 5E, and the intrinsic amorphous silicon layer 116 of FIG. 5E are etched using the third and fourth photoresist patterns 193a and 193b as an etching mask to thereby form a source drain pattern 125, an impurity-doped amorphous silicon pattern 115, and an active layer 120a corresponding to the gate electrode 108 at an area for forming a thin film transistor. Simultaneously, a data line 130 is formed on the gate insulating layer 115. The data line 130 crosses the gate line 107 to define the pixel region P. Here, first and second dummy patterns 121a and 121b of the intrinsic amorphous silicon and the impurity-doped amorphous silicon are formed between the data line 130 and the gate insulating layer 115. The first and second dummy patterns 121a and 121b completely overlap and have the same shape as the data line 130.

Figure 5G:
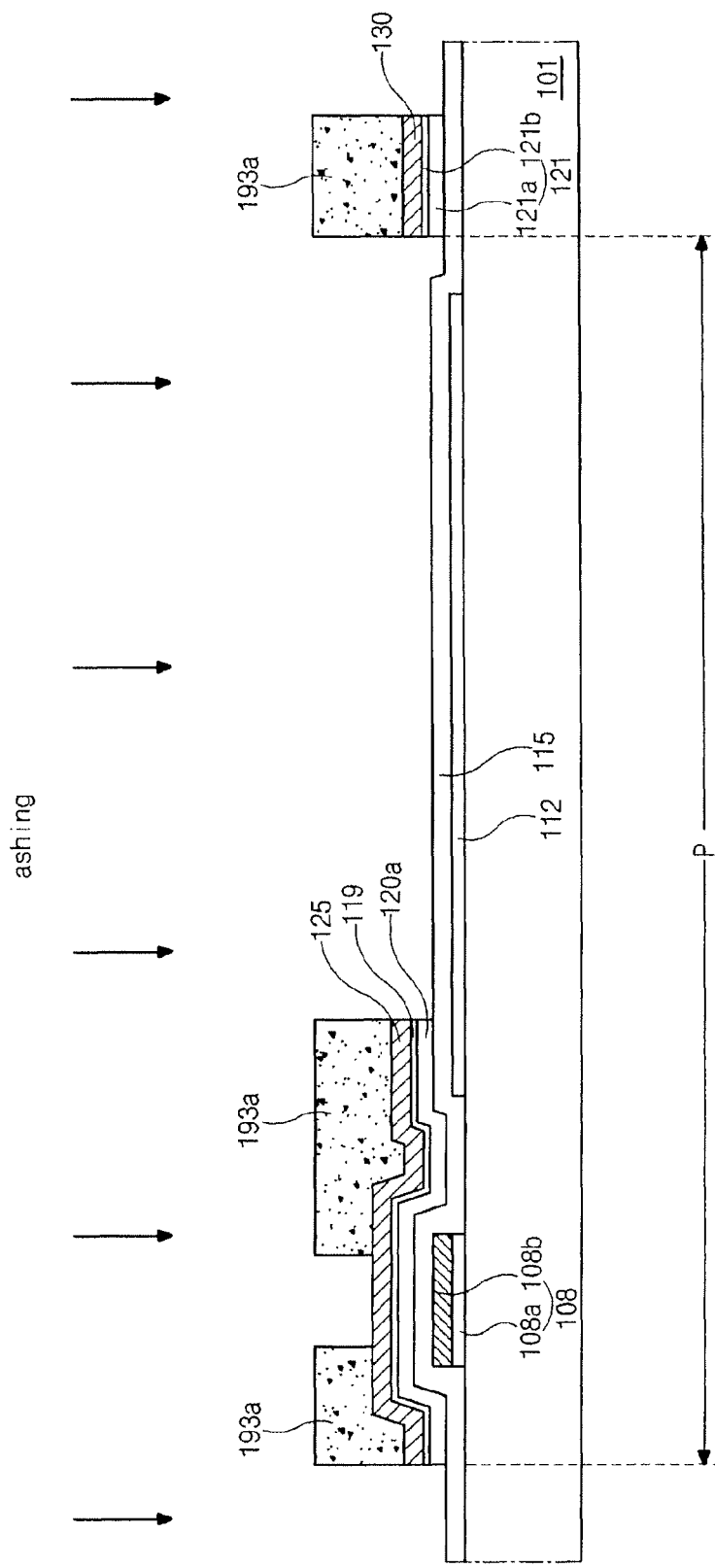

In FIG. 4B and FIG. 5G, an ashing process is performed to thereby remove the fourth photoresist pattern 193b of FIG. 5F having the fourth thickness and expose a central portion of the source drain pattern 125. Here, the third photoresist pattern 193a still remains on the source drain pattern 125. At this time, the third photoresist pattern 193a also is partially removed by the ashing process, and the third thickness of the third photoresist pattern 193a is reduced.

Figure 5H:
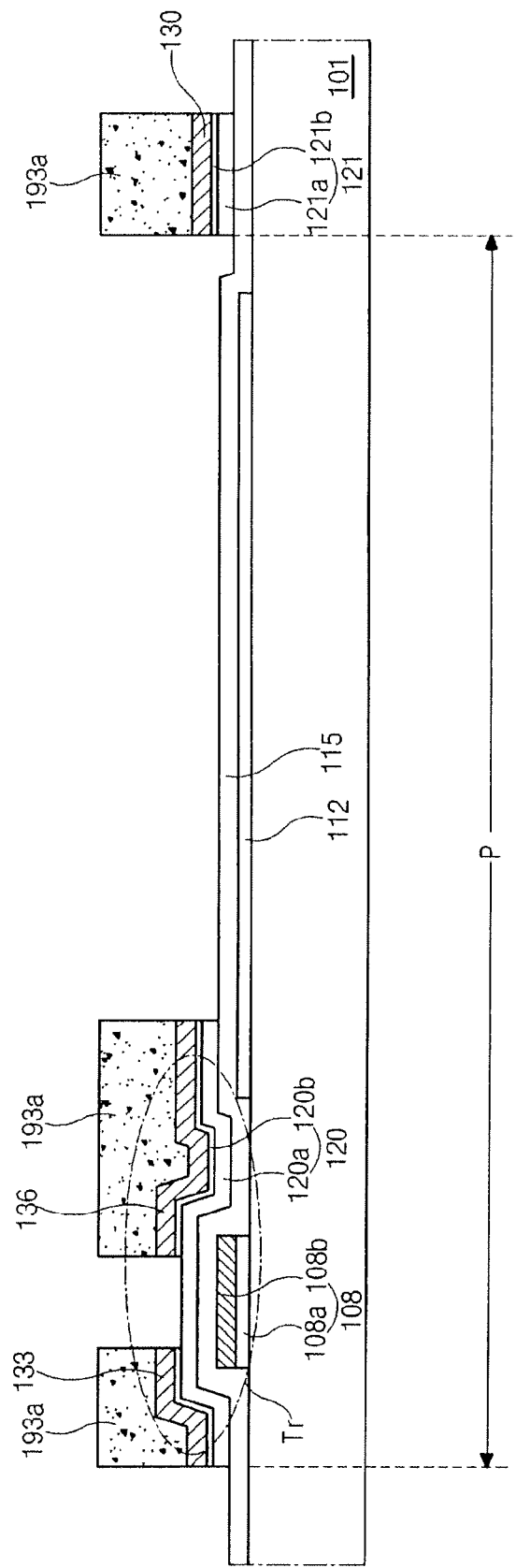

Next, in FIG. 4B and FIG. 5H, the source drain pattern 125 of FIG. 5G, which is exposed by removing the fourth photoresist pattern 193b of FIG. 5F, and the impurity-doped amorphous silicon pattern 119 of FIG. 5G are dry-etched and removed by using the third photoresist pattern 193a as an etching mask, thereby forming source and drain electrodes 133 and 136 and ohmic contact layers 120b. The source and drain electrodes 133 and 136 are spaced apart from each other. The ohmic contact layers 120b have the same shape as the source and drain electrodes 133 and 136. The active layer 120a and the ohmic contact layers 120b constitute a semiconductor layer 120.

Here, an end of the drain electrode 136 overlaps the pixel electrode 112 with the gate insulating layer 115 and the semiconductor layer 120 therebetween.

The gate electrode 108, the gate insulating layer 115, the semiconductor layer 120, and the source and drain electrodes 133 and 136 form a thin film transistor Tr, a switching element.

Figure 5I:
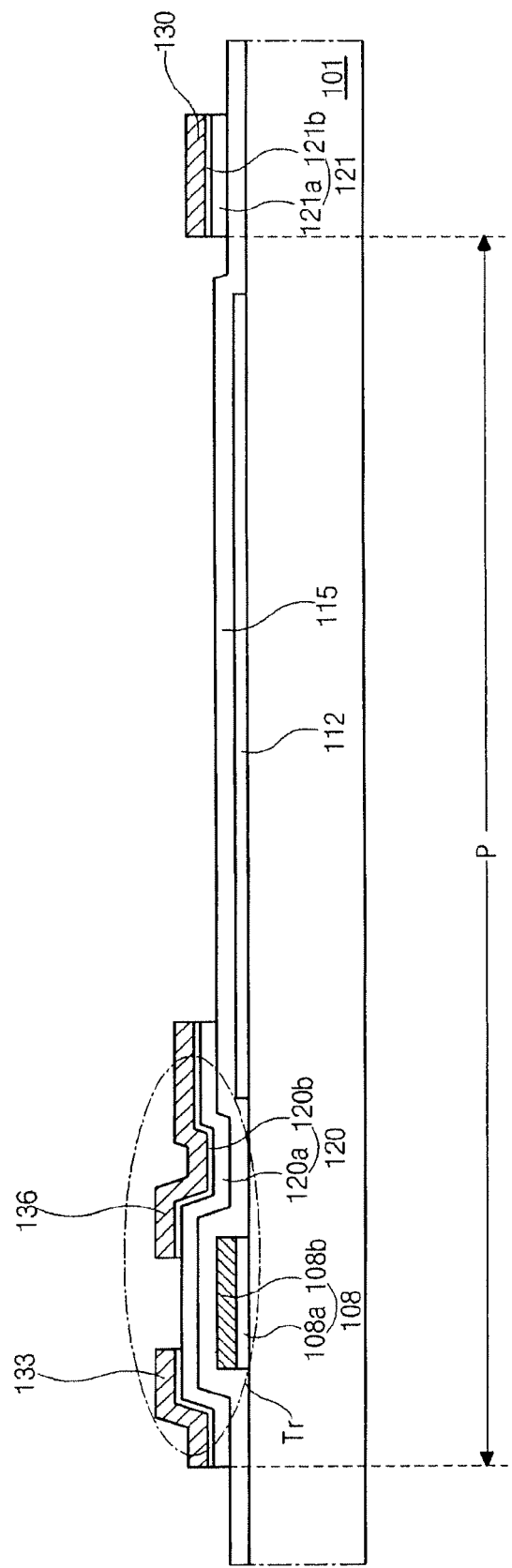

In FIG. 4B and FIG. 5I, a stripping process is performed, and the third photoresist pattern 193a of FIG. 5H are removed to thereby expose the data line 130 and the source and drain electrodes 133 and 136.

Figure 4C:
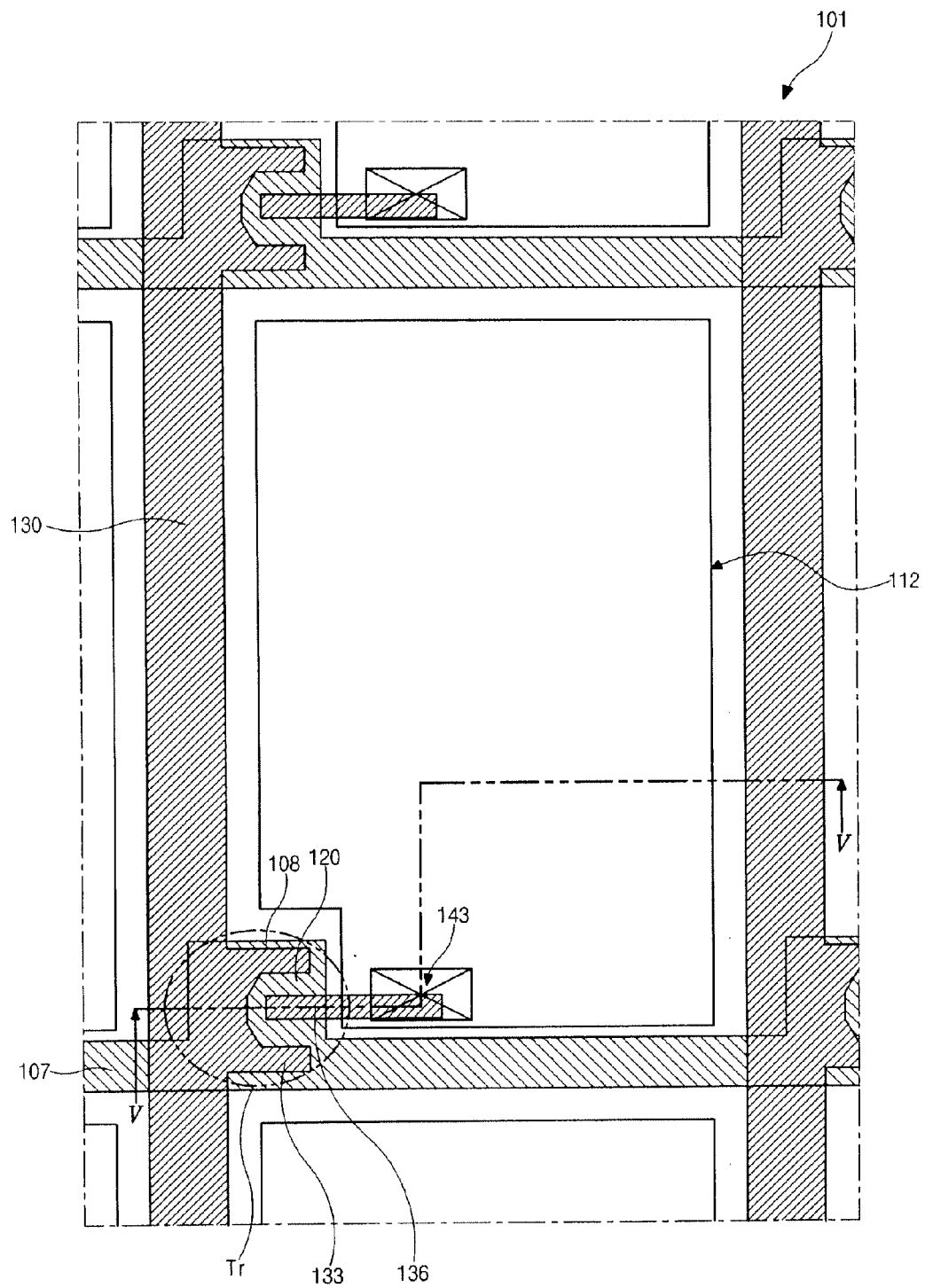
Figure 5J:
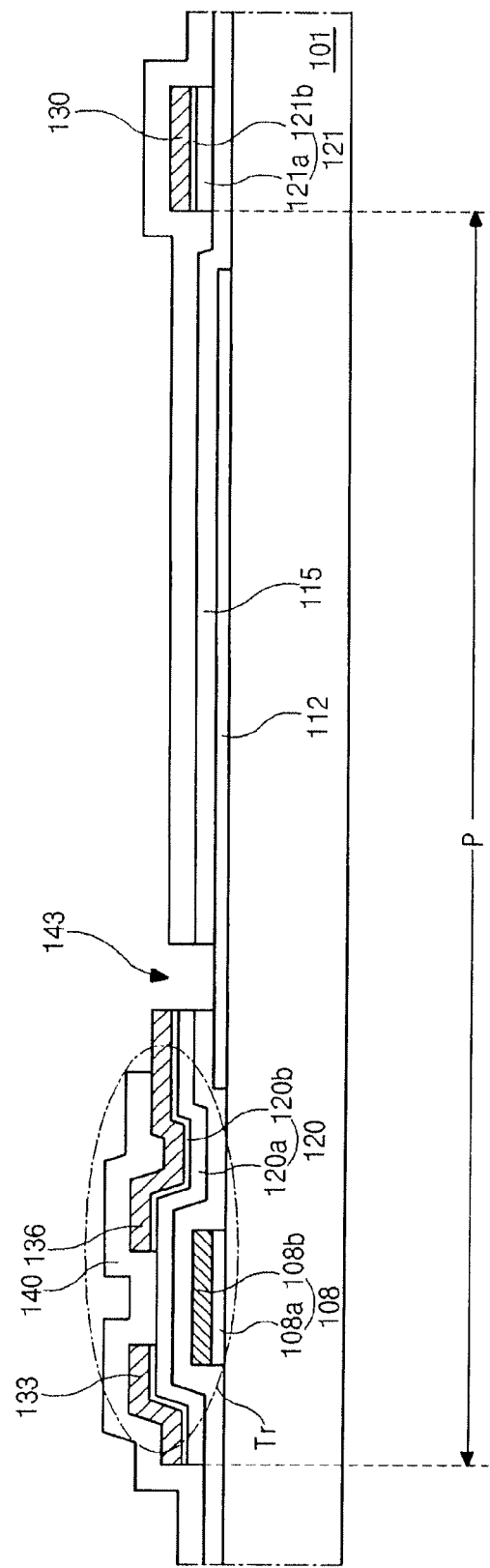

In FIG. 4C and FIG. 5J, a passivation layer 140 is formed on a substantially entire surface of the substrate 101 including the thin film transistor Tr and the data line 130 by depositing an inorganic insulating material, for example, silicon oxide (SiO2) or silicon nitride (SiNx) or applying an organic insulating material, for example, benzocyclobutene (BCB) or photo acryl.

Next, the passivation layer 140 and the gate insulating layer 115 are patterned through a mask process to thereby form a contact hole 143 that exposes parts of the drain electrode 136 and the pixel electrode 112. The contact hole 143 exposes top surfaces of the drain electrode 136 and the pixel electrode 112 and also exposes side surface of the drain electrode 136 and the semiconductor layer 120.

Figure 4D:
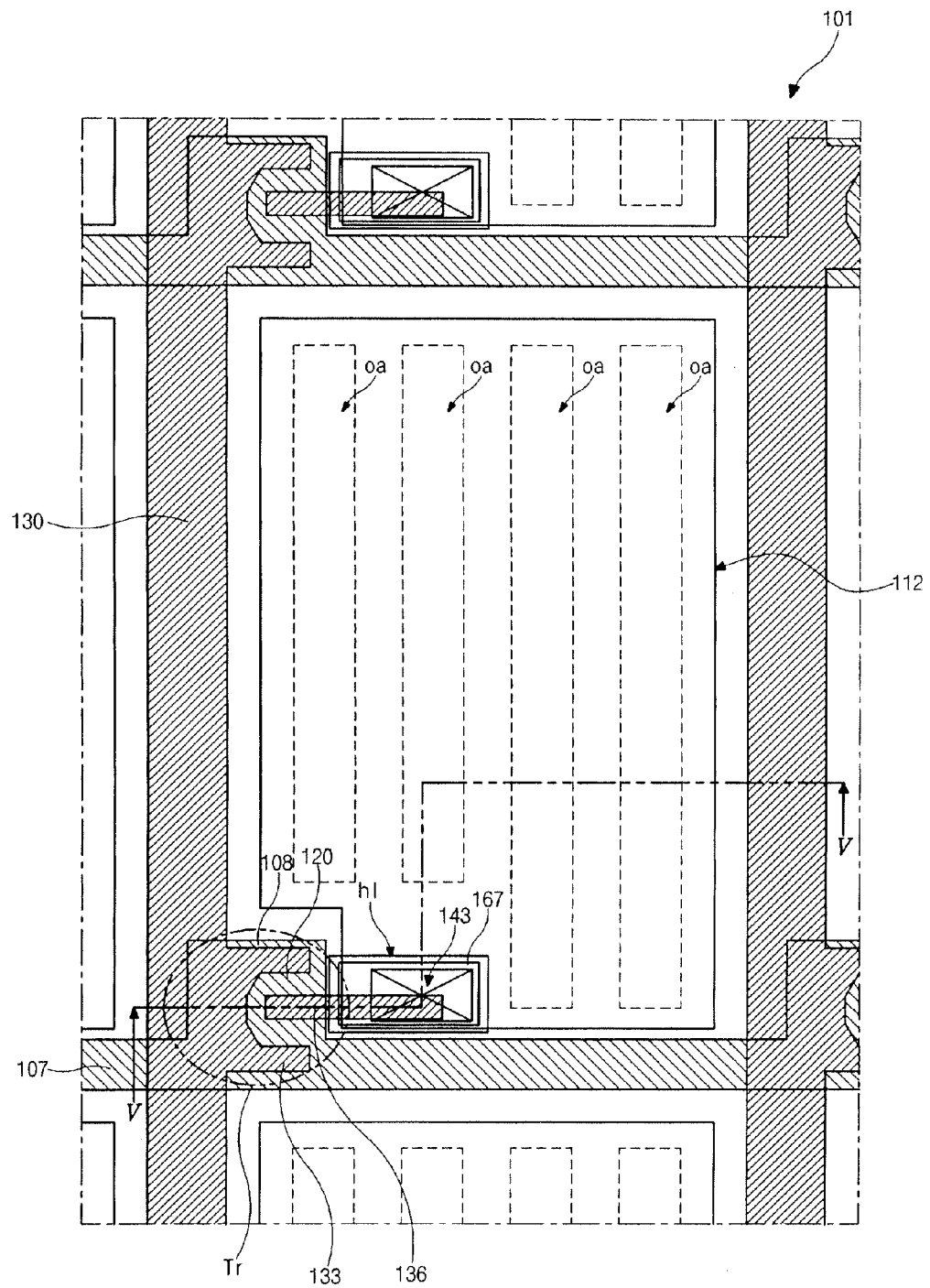
Figure 5K:
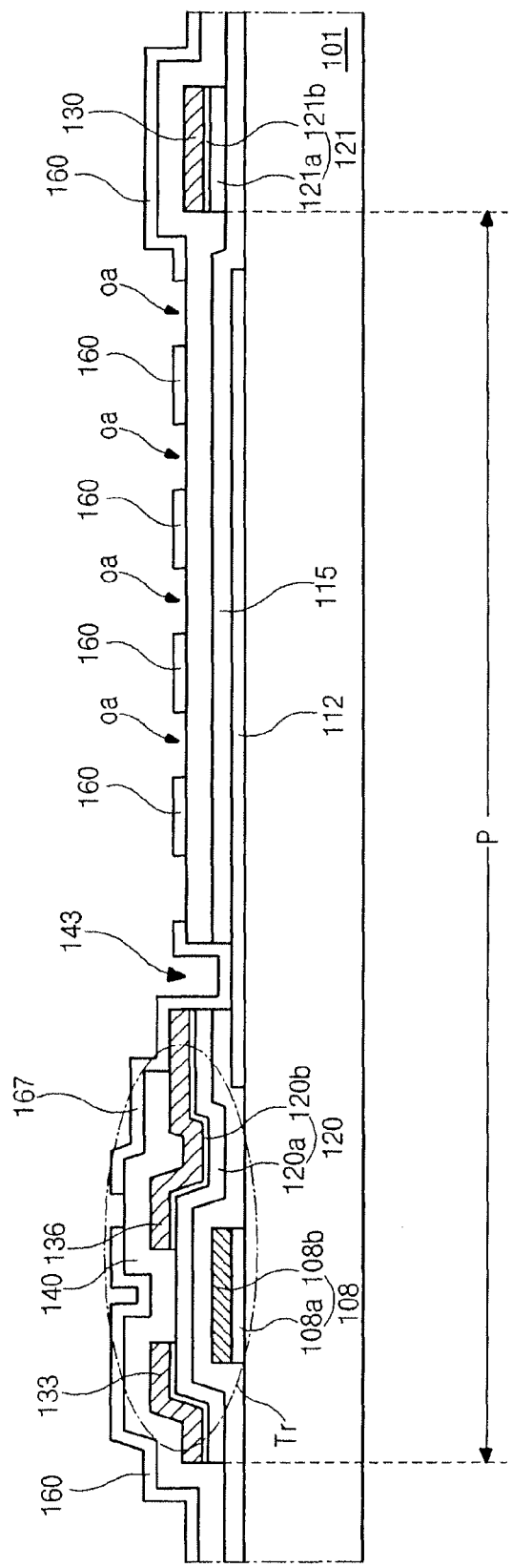

In FIG. 4D and FIG. 5K, a second transparent conductive material layer (not shown) is formed on the passivation layer 140 having the contact hole 143. The second transparent conductive material layer may be formed by depositing indium tin oxide (ITO) or indium zinc oxide (IZO).

Then, the second transparent conductive material layer is patterned through a mask process to thereby form a common electrode 160 and a connection pattern 167. The common electrode 160 overlaps the pixel electrode 112 and has openings oa in the pixel region P and a hole h1 corresponding to the contact hole 143. The common electrode 160 also overlaps the gate line 107 and the data line 130. The openings oa have a bar shape and are spaced apart from each other. The hole h1 has a larger size than the contact hole 143. The connection pattern 167 is larger than the contact hole 143 and smaller than the hole h1, so that the connection pattern 167 is disposed in the hole h1 and is spaced apart from the common electrode 160. The connection pattern 167 contacts the drain electrode 136 and the pixel electrode 112 and electrically connects the drain electrode 136 and the pixel electrode 112.

Accordingly, the array substrate for the FFS mode LCD device according to the present invention is completed.

The array substrate for the FFS mode LCD device according to the present invention has the following technical features. The pixel electrode 112 in the pixel region P has a plate shape. The pixel electrode 112 is formed under the gate insulating layer 115 and contacts the substrate 101. The drain electrode 136 overlaps the pixel electrode 112, and the passivation layer 140 has the contact hole 143 exposing the drain electrode 136 and the pixel electrode 112 with the gate insulating layer 115. The common electrode 160 on the passivation layer 140 includes the bar-shaped openings oa corresponding to the pixel region P and the hole h1 corresponding to the contact hole 143. The connection pattern 167 is larger than the contact hole 143 and smaller than the hole h1 and is disposed in the hole h1. The connection pattern 167 contacts the drain electrode 136 and the pixel electrode 112.

Additionally, in the array substrate for the FFS mode LCD device according to the present invention, the thin film transistor Tr including the gate electrode 108, the gate insulating layer 115, the semiconductor layer 120, and the source and drain electrodes 133 and 136 is formed at the pixel region P. The gate line 107 including at least two layers is connected to the gate electrode 108 of the thin film transistor Tr, and the data line 130 connected to the source electrode 133 of the thin film transistor Tr crosses the gate line with the gate insulating layer 115 therebetween.

Meanwhile, in the array substrate for the FFS mode LCD device according to the present invention, the openings oa of the common electrode 160 having the bar shape are straight, for example. The openings oa of the common electrode 160 may be bent and symmetric with respect to a supposed horizontal line parallel to the gate line 107 and crossing a central portion of the pixel region P. At this time, the data line 130 also may be bent corresponding to the central portion of the pixel region P to thereby form a zigzag shape in a display region of the device.

The array substrate for the FFS mode LCD device according to the present invention is manufactured through four mask processes. Therefore, the productivity per unit time is increased due to a decrease of the manufacturing processes. The materials and the apparatuses for manufacturing the array substrate are minimized, and the manufacturing costs are decreased.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an array substrate for a fringe field switching mode liquid crystal display device, comprising:

forming a gate line, a gate electrode and a pixel electrode on a substrate including a pixel region defined thereon, the pixel electrode disposed in the pixel region;

forming a gate insulating layer on the gate line, the gate electrode and the pixel electrode;

forming a data line, a source electrode, a drain electrode, and a semiconductor layer on the gate insulating layer, the data line crossing the gate line to define the pixel region, the semiconductor layer disposed over the gate electrode, the source electrode and the drain electrode spaced apart from each other over the semiconductor layer, the drain electrode overlapping the pixel electrode;

forming a passivation layer on the data line, the source electrode and the drain electrode;

forming a contact hole exposing a top surface and a side surface of the drain electrode and the pixel electrode by patterning the passivation layer and the gate insulating layer; and forming a common electrode and a connection pattern on the passivation layer, wherein the common electrode includes bar-shaped openings in the pixel region and a hole corresponding to the contact hole, and wherein the connection pattern is disposed in the hole, is spaced apart from the common electrode and directly contacts the top surface and side surface of the drain electrode and the pixel electrode.

2. The method according to claim 1, wherein the gate line and the gate electrode have a multiple-layered structure including a transparent conductive material layer, and the pixel electrode has a single-layered structure including a transparent conductive material layer.

3. The method according to claim 2, wherein forming the gate line, the gate electrode and the pixel electrode includes:

sequentially forming a transparent conductive material layer and a metallic layer;

forming first and second photoresist patterns on the metallic layer, wherein the first photoresist pattern is thicker than the second photoresist pattern;

removing the metallic layer and the transparent conductive material layer using the first and second photoresist patterns as an etching mask to thereby form the gate line, the gate electrode, the pixel electrode and a dummy metallic pattern, the dummy metallic pattern disposed on the pixel electrode;

removing the second photoresist pattern by an ashing process to thereby expose the dummy metallic pattern;

removing the dummy metallic pattern to thereby expose the pixel electrode; and removing the first photoresist pattern.

4. The method according to claim 1, wherein forming the data line, the source electrode, the drain electrode and the semiconductor layer includes:

forming an intrinsic amorphous silicon layer, an impurity-doped amorphous silicon layer, and a metallic layer on the gate insulating layer;

forming first and second photoresist patterns on the metallic layer, wherein the first photoresist pattern is thicker than the second photoresist pattern;

removing the metallic layer, the impurity-doped amorphous silicon layer, and the intrinsic amorphous silicon layer using the first and second photoresist patterns as an etching mask to thereby form the data line, a source drain pattern, an impurity-doped amorphous silicon pattern and an intrinsic amorphous silicon pattern;

removing the second photoresist pattern by an ashing process to thereby a central portion of the source drain pattern;

removing the central portion of the source drain pattern and the impurity-doped amorphous silicon pattern to thereby form the source electrode, the drain electrode and the semiconductor layer, wherein the semiconductor layer includes an active layer of intrinsic amorphous silicon and ohmic contact layers of impurity-doped amorphous silicon; and removing the first photoresist pattern.

5. The method according to claim 1, wherein the connection pattern has a larger size than the contact hole.

\* \* \* \* \*